April 7, 1953 J. I. PANTCHECHNIKOFF 2,634,323

HIGH GAIN SEMICONDUCTOR AMPLIFIER

Filed Dec. 28, 1949 2 SHEETS—SHEET 1

Inventor
JACQUES I. PANTCHECHNIKOFF

By H. W. Mueston

Attorney

HIGH GAIN SEMICONDUCTOR AMPLIFIER

Filed Dec. 28, 1949 2 SHEETS—SHEET 2

Inventor

JACQUES I. PANTCHECHNIKOFF

By H. L. Newton

Attorney

Patented Apr. 7, 1953 2,634,323

UNITED STATES PATENT OFFICE 2,634,323

HIGH GAIN SEMICONDUCTOR AMPLIFIER

Jacques I. Pantchechnikoff, Princeton, N. J., assignor to Radio Corporation of America, a corporation of Delaware Application December 28, 1949, Serial No. 135,395

17 Claims. (Cl. 175—366)

This invention relates to semi-conductor devices and particularly to semi-conductor amplifiers or oscillators having an improved gain as well as to a method of preparing such devices.

A semi-conductor device which may provide an amplifier or oscillator includes a semi-conducting crystal such as a germanium crystal having three electrodes in contact therewith. One of the electrodes has a low-resistance, non-rectifying contact with the crystal and is called the base electrode. The base electrode usually has a large-area contact with the crystal. The other two electrodes make high-resistance, rectifying contacts with the crystal and usually are point contacts. If a bias voltage is impressed in the forward direction between the base electrode and one of the rectifying electrodes, the electrode will emit charge carriers and is therefore called the emitter electrode. A bias voltage in the forward direction should render the emitter electrode positive with respect to the crystal in case the crystal is of the N type which is assumed to have a P type surface layer. If the crystal is of the P type which is assumed to have an N type surface layer, the forward bias voltage should make the emitter electrode negative with respect to the crystal. A comparatively large reverse bias voltage is impressed between the other rectifying electrode and the base electrode to permit the rectifying electrode to collect the charge carriers. This electrode is accordingly called the collector electrode. For an N type crystal the collector electrode should be negative with respect to the base electrode.

Experiments have shown that the gain of such a semi-conductor device which has been called a transistor, depends upon the forces exerted on the emitter and collector electrodes. Actually, the factor which determines the gain is the contact pressure between emitter and collector electrodes and the crystal. The pressure is defined as the force divided by the contact area. It has been found that the contact pressure between the collector electrode and the crystal should be different from the contact pressure between the emitter electrode and the crystal for maximum gain.

It is accordingly the principal object of the present invention to provide an improved semi-conductor device suitable as an amplifier or oscillator having means for establishing predetermined optimum electrodal contact pressures for improved gain, and to provide a novel method of preparing such a device whereby said optimum contact pressures may be attained.

A further object of the invention is to provide a semiconductor amplifier or oscillator having an electrodal arrangement establishing contact pressures between the emitter electrode and the semi-conductor crystal, on the one hand, and between the collector electrode and the crystal, on the other hand, for an operating condition of maximum gain.

In accordance with the present invention, it has been found that for optimum gain conditions the contact pressure between the emitter electrode and the crystal of the semi-conductor device should be a maximum while the contact pressure between the collector electrode and the crystal should be a minimum. It has been discovered that the maximum contact pressure between the emitter electrode and the crystal may be the yield pressure of the material of the emitter electrode. Likewise, it has been found that the contact pressure between the collector electrode and the crystal should be the minimum pressure which will still insure good electrical contact between the collector electrode and the crystal. Obviously, the contact pressures may be varied by either varying the forces pressing or biasing the electrodes against the crystal or by varying the contact areas between the electrodes and the crystal. Thus, the contact area of the collector electrode may be made larger than that of the emitter electrode. Alternatively, the force pressing the collector electrode against the crystal may be made smaller than the force pressing the emitter electrode against the crystal. It is also feasible to use both alternatives.

The novel features that are considered characteristic of this invention, however, are set forth with particularity in the appended claims. The invention itself, however, both as to its organization and method of operation, as well as additional objects and advantages thereof, will best be understood from the following description when read in connection with the accompanying drawings, in which:

Figure 7:
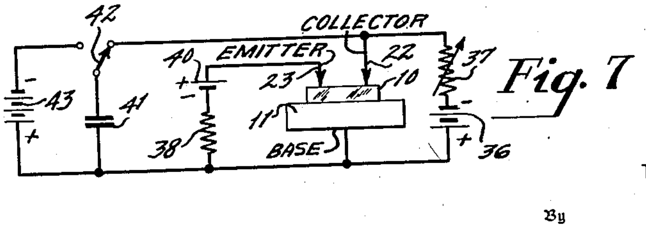
Figure 8:
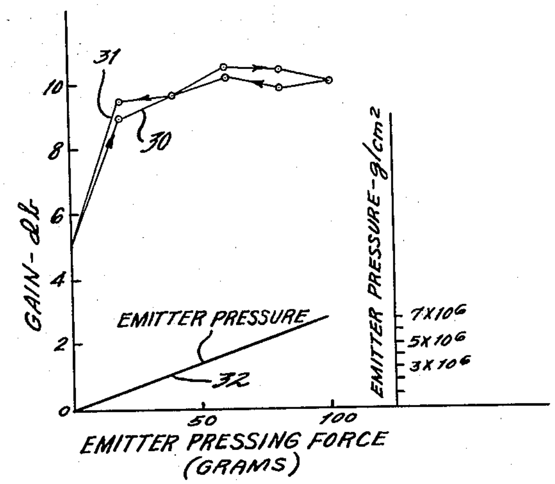
Figure 9:
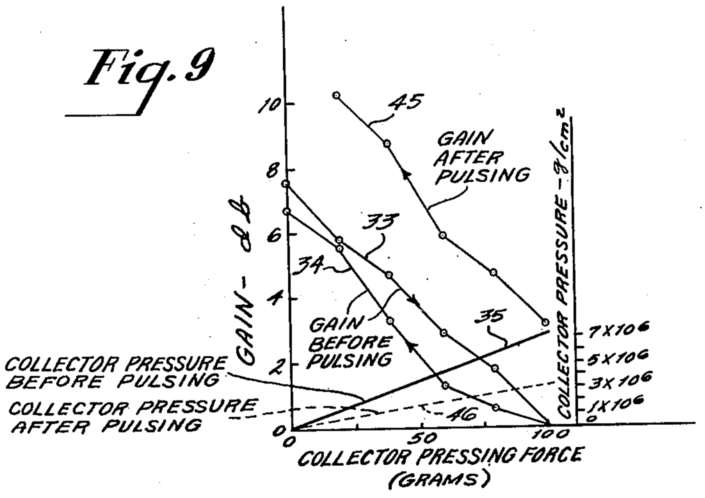

Figure 7 is a schematic circuit diagram of a semi-conductor device connected for passing electric pulses through the collector electrode; and Figures 8 and 9 are graphs showing curves illustrating the relationship between the gain in db (decibels) and the emitter biasing force or the collector biasing force, respectively, and also the relationship between the biasing forces and the contact pressures.

Figure 1:
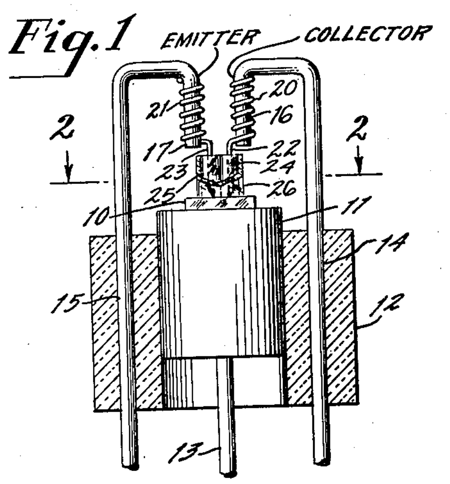
Figure 1 is an elevational view, partly in section, of a semi-conductor device embodying the present invention.
Figure 2:
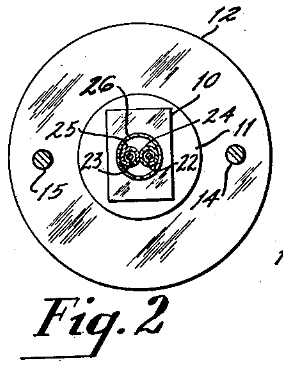
Figure 2 is a cross-sectional view of the device shown in Figure 1, taken on line 2—2 of Figure 1.

Referring now to the drawings in which like components have been designated by the same reference numerals throughout the figures, and particularly to Figures 1 and 2, there is illustrated a semi-conductor device embodying the present invention which may be used as an amplifier, oscillator or the like. The device comprises a block or body 10 of semi-conducting material consisting, for example, essentially of a chemical element having semi-conducting properties such as germanium, silicon, boron, tellurium, or selenium containing a small but sufficient number of atomic impurity centers or lattice imperfections as commonly employed for best results in crystal rectifiers. Germanium is the preferred material for block 10 and may be prepared so as to be an electronic N type semiconductor crystal as is well known. The top surfaces of semi-conducting block 10 may be polished and etched as is conventional. It is also feasible to utilize the germanium block from a commercial high-back-voltage germanium rectifier such as the type 1N34.

Block 10 is secured to metallic stud 11 which may consist, for example, of brass. Block 10 may be soldered or sweated to stud 11 to provide a low-resistance contact between block 10 and stud 11 which latter functions as the base electrode of the device. Stud 11 may be cylindrical in shape as shown particularly in Figure 2 and is disposed in hollow cylindrical support 12 which may consist of a suitable insulating material such as Bakelite. Stud 11 preferably has a press fit with support 12. A lead 13 which may consist of a heavy wire is secured to stud 11 by forcing it, for example, into a suitable opening in the stud. Two leads or conductors 14 and 15 extend through support 12. The upper ends of leads 14 and 15 are substantially U-shaped with vertical depending portions 16 and 17 respectively which may serve as mandrels.

Two wires 20 and 21 are wound helically about mandrels 16 and 17 respectively. Wires 20 and 21 may, for example, consist of Phosphor bronze or tungsten wires having a diameter of a few mils. Wires 20 and 21 are in electrical contact with mandrels 16 and 17 and function as compression springs. The free ends 22 and 23 of wires 20 and 21 extend in the direction of the axes of mandrels 16 and 17 and are in contact with the upper surface of block 10. Wires 20 and 21 form accordingly small-area, high-resistance rectifying electrodes which may provide the emitter and collector electrodes of the device as indicated in Figure 1.

The free ends 22 and 23 of wires 20, 21 preferably are insulated from each other by tubes 24, 25 which individually surround the wires. Tubes 24 and 25 consist of an insulating material such as glass and may be enclosed by an outer glass tube 26 for guiding and spacing wires 22 and 23. The tips of wires 22 and 23 preferably have conical points, or chisel points as shown in Figure 1.

In accordance with the present invention it has been found experimentally that the gain of an amplifier device of the type illustrated in Figure 1 depends upon the contact pressure between emitter electrode 23 and body 10 on the one hand and between collector electrode 22 and body 10 on the other hand. The relationship between the emitter pressing force and the gain in db has been illustrated in Figure 8 for an emitter electrode consisting of Phosphor bronze. The force pressing emitter electrode 23 against body 10 is indicated in grams where one gram is the unit of force. Thus, curve 30 of Figure 8 shows the relationship between the gain in db and the pressing force when the force is gradually increased while curve 31 shows the same relation and with decreasing force.

Curve 32 of Figure 8 shows the emitter pressure as related to the emitter pressing force. The pressure is defined as the force divided by the area and may be given in gram per square centimeter. 1,000 grams per square centimeter equal one kilogram per square centimeter which in turn is equivalent to one atmosphere. It follows from curve 32 that the contact area between emitter electrode 23 and body 10 is approximately $1.4\times10^{-5}$ cm.$^2$ or 2.2 square mils.

Curves 30 and 31 of Figure 8 show that the gain is a maximum if the emitter pressure becomes a maximum. Of course the pressure cannot exceed the yield pressure of the emitter material which is Phosphor bronze for the curves of Figure 8. The yield pressure of germanium is so large compared to that of Phosphor bronze that the maximum pressure obtainable is determined by the emitter material. It follows from curves 30 and 31 that the emitter pressure for an emitter electrode of Phosphor bronze should be larger than 2,000 atmospheres and should preferably be approximately 7,000 atmospheres for maximum gain.

Figure 9 shows similar curves for a collector electrode of Phosphor bronze. Curve 33 indicates the gain with increasing force while curve 34 shows the gain with decreasing force. Curve 35 again relates the collector pressing force to the collector pressure. The area of the collector electrode is the same as that of the emitter electrode.

It will readily be apparent that the gain increases as the collector pressure decreases. Accordingly, the collector pressure should be less than 500 atmospheres and should preferably be approximately 200 atmospheres. The collector pressure accordingly should be the minimum pressure which will insure good electrical contact between the collector electrode and body 10.

Figure 3:
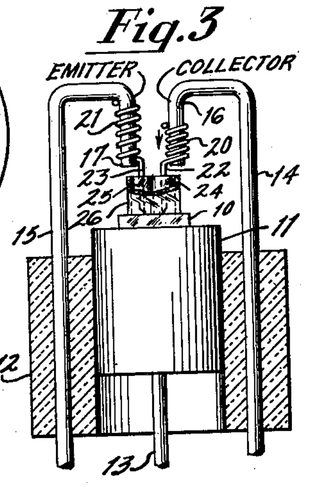
Figure 3 is an elevational view, partly in section, of the semi-conductor device of Figure 1 and illustrating how the pressure exerted on the collector electrode during electric pulsing may be increased to increase the contact area of the collector electrode.

In accordance with the present invention the collector pressure may be reduced by increasing the contact area of the collector electrode. This may be effected as illustrated in Figure 3. Thus, wire 20 may be compressed against body 10 as clearly shown in Figure 3. To this end wire 20 may be pushed down with a pair of tweezers or any other suitable device. While the force acting on wire 20 is thus increased, electric pulses of direct current are passed through collector electrode 22. Such pulsing of the collector electrode has been disclosed and claimed in a copending application to L. E. Barton, Serial No. 118,428 filed on September 28, 1949, and entitled "Process of Preparing Semiconductor Devices."

The device of Figure 3 may be pulsed by means of the circuit illustrated in Figure 7. In Figure 7 base electrode 11, emitter electrode 23 and collector electrode 22 are shown schematically only. Battery 36 and variable resistor 37 are serially connected between base electrode 11 and collector electrode 22. Battery 36 is poled in such a way that a reverse bias voltage is impressed on collector electrode 22. Thus, for an N type crystal 10 the negative pole of battery 36 should be connected to collector electrode 22. Battery 36 and variable resistor 37 schematically indicate a high-impedance constant-current generator which may take any suitable form well known in the art.

Resistor 38 and battery 40 are connected in series between base electrode 11 and emitter electrode 23 to provide a bias voltage in the forward direction to emitter electrode 23. Assuming again that block 10 consists of an N type crystal the positive pole of battery 40 should be connected to emitter electrode 23. A direct current of approximately five milliamperes should flow through emitter electrode 23 and a direct current of approximately three milliamperes should flow through collector electrode 22. Capacitor 41 which may have a capacitance of .01 microfarad may be connected through switch 42 between collector electrode 22 and base electrode 11. Capacitor 41 may be connected through switch 42 across battery 43 thereby to charge it to a negative voltage of approximately 150 volts. This charge may then be applied to collector electrode 22 by means of switch 42. One or more pulses may be passed through collector electrode 22 in this manner.

Collector electrode 22 is preferably pulsed while the pressing force is increased as shown in Figure 3. The pulses will heat the tip of collector electrode 22 so that its contact area increases. The contact area may, for example, increase from 2.2 to 5 square mils. The effect of this pulsing of collector electrode 22 is illustrated in Figure 9. Thus, curve 45 shows the gain with decreasing force while curve 46 indicates the collector pressure after pulsing which is smaller due to the increased collector area. The gain was measured while the increased force on collector electrode 22 was gradually released again.

It will accordingly be seen that the gain of an amplifier device as shown in Figures 1 and 2 may be appreciably increased when the contact area of the collector electrode is increased while the force on both emitter and collector electrodes may remain the same. It is, of course, also possible to further decrease the collector force compared to the emitter force.

It is also feasible to provide collector and emitter electrodes which consist of tungsten. Experiments have shown that in this case the optimum emitter pressure should be approximately 20,000 atmospheres while the optimum collector pressure should be approximately 3,000 atmospheres. However, the difference in gain caused by a variation of the collector and emitter pressures which may be obtained if both electrodes consist of tungsten, is considerably smaller than the difference in gain caused by a variation of the pressures if both electrodes consist of Phosphor bronze. Accordingly, the emitter and collector electrodes preferably consist of Phosphor bronze in accordance with the invention.

It is believed that the increase in gain obtained in accordance with the invention is due to the increase of the impedance looking into the collector electrode and to the simultaneous decrease of the impedance looking into the emitter electrode. Thus, if the current gain of a semi-conductor amplifier is unity, the power gain is determined by the internal collector impedance divided by the internal emitter impedance representing the voltage gain. Since this ratio of the impedance is increased in accordance with the invention the power gain is also increased.

Figures 4, 5, 6:
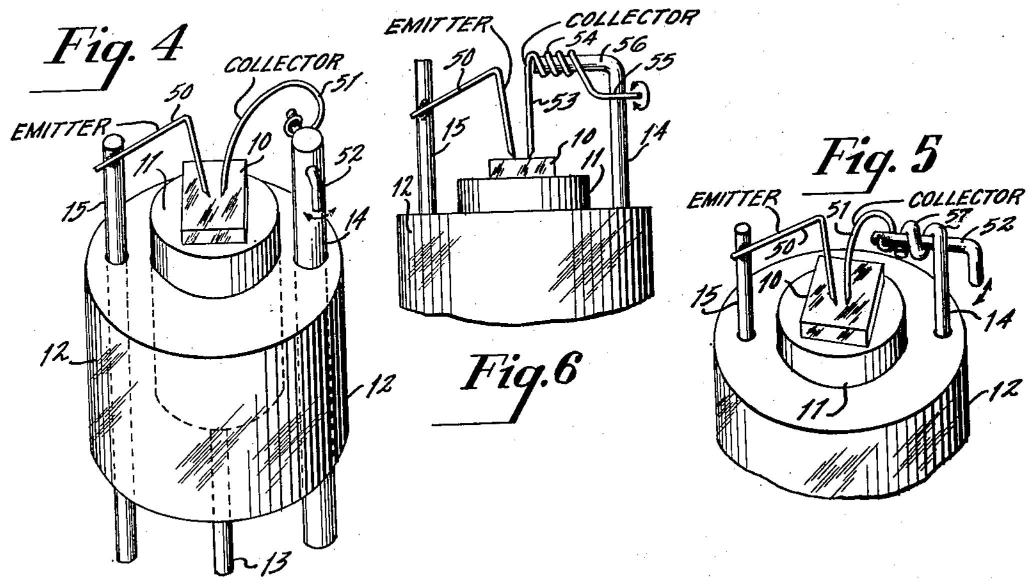
Figures 4 and 5 are views in perspective of modified semi-conductor devices in accordance with the invention, showing means permitting adjustment of the force exerted on the collector electrode.
Figure 6 is an elevational view of still another modification of the semi-conductor device in accordance with the invention showing means permitting adjustment of the collector force.

The force acting on the collector electrode may be adjusted, for example, by the devices illustrated in Figures 4 to 6. Referring now to Figure 4, emitter electrode 50 consists of a stiff wire having a straight portion in contact with block 10 and another straight portion angularly disposed with respect to the first portion which may be welded or otherwise secured to lead 15. Wire 50 has a pointed tip as shown. Collector electrode 51 consists of a spiral wire having an increasing radius to form a torsion spring. One end of wire 51 is secured to an L-shaped handle 52 which extends through lead 14. Lead 14 must be sufficiently thick to receive handle 52. Thus, by rotating handle 52, torsion spring 51 may be compressed or released, thereby to increase the force with which collector electrode 51 is pressed against block 10.

It is accordingly feasible to increase the pressure on collector electrode 51 during pulsing and to release it again after the electrode has been pulsed and its contact area increased. Alternatively, the collector force may be reduced compared to the emitter force to provide for a minimum collector pressure.

An alternative device for adjusting the collector force is illustrated in Figure 5. Collector electrode 51 has the same shape as illustrated in Figure 4, and one end of wire 51 is welded or otherwise secured to handle 52. Handle 52 is rotatably mounted in a few turns 57 of lead 14. The construction of Figure 5 makes it possible to use a lead 14 of small diameter while the lead 14 of the device of Figure 4 must be sufficiently thick to function as a bearing for handle 52.

Figure 6 illustrates a collector electrode 53 having a spirally shaped portion 54 and a straight portion in contact with body 10. A handle 55 on collector electrode 53 makes it possible to increase or decrease the force on the collector electrode. The spiral portion 54 of the electrode is wound about a horizontal portion 56 of lead 14.

There has thus been disclosed a semi-conductor amplifier or oscillator with improved power gain. The gain becomes a miximum when the emitter pressure is a miximum while the collector pressure is the minimum pressure which will still insure good electrical contact between the collector electrode and the semi-conducting crystal.

What is claimed is:

1. A semi-conductor device comprising a semi-conducting body, a low-resistance electrode in contact with said body, two rectifying electrodes, each consisting of a filamentary conductor having a tip, and means for pressing the tips of each of said rectifying electrodes individually against said body with differing contact pressures developed by the contact area of the tips of each of said rectifying electrodes with said body.

2. A semi-conductor device comprising a semi-conducting body, a low-resistance non-rectifying electrode in contact with said body, each consisting of a filamentary conductor having a tip, two high-resistance rectifying electrodes, and separate means for pressing the tips of each of said rectifying electrodes individually against said body with differing contact pressures developed by the contact area of the tips of each of said rectifying electrodes with said body, said means being effective to provide a contact pressure developed by the contact area of the tip of one of said rectifying electrodes with said body which is larger than the contact pressure developed by the contact area of the tip of the other of said rectifying electrodes with said body.

3. A semi-conductor device comprising a semi-conducting body, a low-resistance electrode in contact with said body, a pair of filamentary electrodes in contact with said body, one of said filamentary electrodes having a larger contact area with said body than the other filamentary electrode, and means for pressing each of said filamentary electrodes with substantially equal force against said body, whereby the contact pressure of said one of said filamentary electrodes is smaller than that of said other filamentary electrode.

4. A semi-conductor device comprising a semi-conducting body, a low-resistance non-rectifying electrode in contact with said body, a pair of filamentary electrodes, each having a tip in contact with said body, the tip of one of said filamentary electrodes having a larger contact area with said body than the tip of the other filamentary electrode, and means for pressing the tips of said filamentary electrodes with substantially equal force against said body, whereby the contact pressure of said one of said filamentary electrodes is smaller than that of said other filamentary electrode.

5. A semi-conductor device comprising a semi-conducting body, a low-resistance electrode in contact with said body, a pair of filamentary electrodes having substantially equal areas in contact with said body, and means for pressing one of said filamentary electrodes against said body with a larger force than the other filamentary electrode, whereby the contact pressure of said one of said filamentary electrodes is larger than that of said other filamentary electrode.

6. A semi-conductor device comprising a semi-conducting body, a low-resistance non-rectifying electrode in contact with said body, a pair of filamentary electrodes, each having a tip of substantially equal area in contact with said body, and means for pressing the tip of one of said filamentary electrodes against said body with a larger force than the tip of the other filamentary electrode, whereby the contact pressure of said one of said filamentary electrodes is larger than that of said other filamentary electrode.

7. A semi-conductor device comprising a semi-conducting body, a base electrode in contact with said body, an emitter and a collector electrode, and means for pressing said emitter electrode and said collector electrode individually against said body, the contact areas of said emitter electrode with said body and of said collector electrode with said body being so related to the pressing forces that the contact pressure between said emitter electrode and said body is higher than the contact pressure between said collector electrode and said body.

8. A semi-conductor device comprising a semi-conducting body, a base electrode in contact with said body, an emitter and a collector electrode, and means for pressing said emitter electrode and said collector electrode with substantially equal force against said body, the contact area of said emitter electrode with said body and being smaller than that of said collector electrode with said body, whereby the contact pressure between said emitter electrode and said body is higher than the contact pressure between said collector electrode and said body.

9. A semi-conductor device comprising a semi-conducting body, a base electrode in contact with said body, an emitter and a collector electrode, and means for pressuring said emitter electrode and said collector electrode individually against said body, in such a manner that said emitter electrode is pressed with a larger force against said body than said collector electrode is pressed against said body, the contact areas of said emitter electrode with said body and of said collector electrode with said body being substantially equal, whereby the contact pressure between said emitter electrode and said body is higher than the contact pressure between said collector electrode and said body.

10. A semi-conductor device comprising a semi-conducting body, a base electrode in contact with said body, an emitter electrode and a collector electrode, said emitter electrode consisting of a first wire, means for supporting said first wire and said body and for pressing them against each other with such a force that the contact pressure between said first wire and said body approaches the yield pressure of said first wire, said collector electrode consisting of a second wire, and means for supporting said second wire and for pressing it against said body with such a force that the contact pressure between said second wire and said body is the minimum contact pressure which will insure good electrical contact between said collector electrode and said body.

11. A semi-conductor device comprising a semi-conducting body, a base electrode in contact with said body, an emitter electrode and a collector electrode, said emitter electrode consisting of a first wire having a tip, means for supporting said first wire and said body and for pressing the tip of said first wire against said body with such a force that the contact pressure between said first wire and said body approaches the yield pressure of said first wire, said collector electrode consisting of a second wire having a tip, and means for supporting said second wire and for pressing its tip against said body with such a force that the contact pressure between said second wire and said body is the minimum contact pressure which will insure electrical contact between said collector electrode and said body.

12. A semi-conductor device comprising a semi-conducting body, a base electrode in contact with said body, an emitter electrode and a collector electrode, said emitter electrode consisting of a first wire, means for supporting said first wire and said body and for pressing them against each other with such a force that the contact pressure between said first wire and said body approaches the yield pressure of said first wire, said collector electrode consisting of a second wire, means for supporting said second wire, and adjustable means for pressing said second wire against said body with such a force that the contact pressure between said second wire and said body is the minimum contact pressure which will insure good electrical contact between said collector electrode and said body.

13. A semi-conductor device comprising a semi-conducting body, a base electrode in contact with said body, a collector electrode and an emitter electrode, each consisting of a fine wire of Phosphor bronze having a tip in contact with said body, and means for pressing the tips of said wires against said body in such a manner that the contact pressure between said emitter electrode and said body is more than 2,000 atmospheres and that the contact pressure between said collector electrode and said body is less than 500 atmospheres.

14. A semi-conductor device comprising a semi-conducting body, a base electrode in contact with said body, a collector electrode and an emitter electrode, each consisting of a fine wire of Phosphor bronze having a tip in contact with said body, and means for pressing the tips of said wires against said body in such a manner that the contact pressure between said emitter electrode and said body is approximately 7,200 atmospheres and that the contact pressure between said collector electrode and said body is approximately 200 atmospheres.

15. A semi-conductor device comprising a semi-conducting body, a base electrode in contact with said body, a collector electrode and an emitter electrode, each consisting of a fine wire of tungsten having a tip in contact with said body, and means for pressing the tips of said wires against said body in such a manner that the contact pressure between said emitter electrode and said body is approximately 20,000 atmospheres and that the contact pressure between said collector electrode and said body is approximately 3,000 atmospheres.

16. The method of preparing a semi-conductor device having a semi-conducting body and at least one small-area electrode, said method comprising the steps of pressing said electrode against a surface of said body, passing direct current in the reverse direction between said electrode and said body, thereby to increase the contact area of said electrode with said body, and thereafter reducing the force pressing said electrode against said body while maintaining said electrode in electrical contact with said body, whereby the contact pressure between said electrode and said body is substantially reduced.

17. The method of reducing the contact pressure between the collector electrode of a transistor and its semi-conducting body, said transistor including a semi-conducting body and a small-area collector electrode, said method comprising the steps of pressing said collector electrode against a surface of said body with a predetermined force, passing at least one pulse of direct current in the reverse direction between said collector electrode and said body to heat said collector electrode and to increase the contact area of said collector electrode with said body, and thereafter reducing the force pressing said collector electrode against that body while maintaining said collector electrode in electrical contact with said body.

JACQUES I. PANTCHECHNIKOFF.

REFERENCES CITED

The following references are of record in the file of this patent:

UNITED STATES PATENTS

| Number | Name | Date |
|---|---|---|
| 2,524,035 | Bardeen et al. | Nov. 3, 1950 |

OTHER REFERENCES

North, J. Applied Physics, vol. 17, November 1946, pp. 912–915.